United States Patent [19]

Nakajima

[11] Patent Number: 5,063,567
[45] Date of Patent: Nov. 5, 1991

[54] PHOTORECEPTOR FOR FREQUENCY-MODULATED OPTICAL SIGNALS

[75] Inventor: Hisao Nakajima, Paris, France

[73] Assignee: L'Etat Francais represente par le Ministre des Postes, des Telecommunications et de l'Espace (Centre National d'Etudes des Telecommunications), Issy les Moulineaux, France

[21] Appl. No.: 582,157

[22] Filed: Sep. 14, 1990

[30] Foreign Application Priority Data

Sep. 27, 1989 [FR] France ............................. 89 12646

[51] Int. Cl.[5] .................................................. H01S 3/10
[52] U.S. Cl. .................................. 372/28; 372/18; 372/38; 372/44; 372/96; 359/189
[58] Field of Search ............... 372/18, 19, 20, 26, 372/28, 34, 38, 44, 45, 96; 330/4.3; 455/619, 615, 609, 611

[56] References Cited

U.S. PATENT DOCUMENTS

| | | | |
|---|---|---|---|
| 3,976,873 | 8/1976 | Bottka et al. | 455/619 X |
| 4,751,705 | 6/1988 | Hadley et al. | 372/18 |
| 4,755,016 | 7/1988 | DeLoach, Jr. et al. | 350/96.16 |
| 4,805,237 | 2/1989 | Donald et al. | 455/619 |
| 4,821,273 | 4/1989 | Hori | 372/31 |
| 4,862,467 | 8/1989 | Carter et al. | 372/18 |
| 4,903,341 | 2/1990 | Rice | 455/619 |
| 4,930,133 | 5/1990 | Babbitt et al. | 372/32 |

FOREIGN PATENT DOCUMENTS 2110498 6/1983 United Kingdom .

OTHER PUBLICATIONS

Applied Physics Letters, vol. 54, No. 11, 3/13/89, pp. 984-986 (13 Mar. 1989).
IEEE Journal of Quantum Electronics, vol. QE-17, No. 7, 7/81, pp. 1216-1225 (1981).

Primary Examiner—William L. Sikes
Assistant Examiner—Galen J. Hansen
Attorney, Agent, or Firm—Oblon, Spivak, McClelland, Maier & Neustadt

[57] ABSTRACT

Photoreceptor for frequency-modulated optical signals. The photoreceptor consists of a semiconductor laser (10) fed clearly beyond the threshold (12). The optical signal (20) to be demodulated is injected into the laser. The voltage (V) taken at the terminals of the latter reflects the frequency difference between the frequency of the signal (F1, F2) and the actual frequency (Fo) of the laser.

9 Claims, 4 Drawing Sheets

PHOTORECEPTOR FOR FREQUENCY-MODULATED OPTICAL SIGNALS

FIELD OF THE INVENTION

The object of the present invention is to provide a photoreceptor for frequency-modulated optical signals. This invention can be used in optical telecommunications applications and in particular in the embodiment of wavelength multiplexed high density networks. It can also be used in the laboratory to carry out frequency modulation measurements and to characterize semiconductor lasers.

BACKGROUND OF THE INVENTION

From the various types of modulation used for optical signals, FSK ("Frequency Shift Keying") modulation is used extensively. It consists of moving the frequency of the optical signal emitted according to the information to be transmitted. This modulation is easily obtained with a monofrequency semiconductor laser by modulating the polarization current. Contrary to the case with intensity modulation, all the photons emitted by the laser are frequency-modulated, regardless of the modulation depth. In other words, it is equivalent to a 100% modulation.

The detection of FSK modulated optical signals is generally effected by either coherent dectection or by direct intensity modulation conversion via the Fabry-Pérot standard. The first method requires the use of a local oscillator (generally constituted by a wavelength tuneable monofrequency laser), a fast photodetector, a signal mixer and complex electronic circuits (intermediate frequency discriminator, decision circuit, intermediate frequency stabilization circuit, etc); if this results in obtaining good performances, it nevertheless remains difficult to implement. The second method is scarcely less so, requiring as it does the use of a control circuit to tune one of the resonance frequencies of the standard with that of the signal to be demodulated. In addition, it does not make it possible to tune the frequency over a wide range, this proving to be incompatible with the high density wavelength multiplexing of channels.

As regards these problems concerning optical telecommunications modulation and demodulation, reference may be made to the article by Yoshihisa YAMAMOTO et al published in the IEEE Journal of Quantum Electronics, vol. QE-17, No. 6, June 1981, pp. 919 to 935.

Furthermore, there are a number of photoreceptors relatively simple to implement which use a semiconductor laser into which the luminous beam to be processed is injected. These devices do not strictly function as demodulators, but rather as automatic frequency control means. Such a device is described in the article by Soichi KOBAYASHI et al and entitled "Automatic Frequency Control in a Semiconductor Laser and an Optical Amplifier" published in the Journal of Lightwave Techology, vol. LT-1, No. 2, June 1983, pp. 294-401 and in the article by Soichi KOBAYASHI et al and entitled "Injection Locking Characteristics of an AlGaAs Semiconductor Laser" published in the IEEE Journal of Quantum Electronics, vol. QE-16, No. 9, September 1980, pp. 915 to 917.

As the invention to be described shortly makes use of certain elements of this known technique, the main characteristics of the latter shall not be described again.

The technique described in the afore-mentioned articles uses a semiconductor laser into which the luminous beam to be processed is injected ("Optical-Injection-Locking" technique). The laser is fed with current approaching the threshold (that is, virtually between 0.7 and 1.3 times the threshold current). The laser then functions as an amplifier system and is referred to as an "injection-locked amplifier" (ILA) or a "resonant-type amplifier" (RTA). The laser emitting the radiation is known as the "master" laser and the laser into which the radiation is injected is known as the "slave" laser.

The slave laser operates within a certain frequency band. At the crossing of the active layer of the amplifier, the injected beam is amplified according to the place occupied by the frequency of the beam within the amplification band. This amplification is maximum at the center of the band and decreases on both sides.

The injection of photons into the active layer has the effect of significantly increasing the density of photons and correlatively the optical power produced. As a result, the voltage at the terminals of the laser reduces slightly. As indicated on the curve of the accompanying FIG. 1 (which approximately reproduces one of the curves of FIG. 6 of the first article by KOBAYASHI referred to earlier), the reduction of the voltage V has a resonant shape (that is, an inverted bell) with a minimum (or, if desired, a voltage difference maximum) when the frequency F of the injected optical signal deriving from the master laser is equal to the central frequency Fo of the amplification band of the slave laser. This voltage difference reduces when the frequency F is removed from Fo so as to be annuled when the frequency F leaves the locking zone.

This phenomenon is naturally linked to the value of the polarization current of the slave laser. FIG. 2 (which roughly reproduces one of the curves of FIG. 4 of the aforesaid document) shows the variation of the voltage $\Delta V$ according to the ratio I/Io. This variation is that much larger when the polarization current approaches the threshold current (I/Is=1). The voltage variation becomes almost nil when the slave laser is polarized by a current 1.3 or 1.4 times greater than the threshold current. (The logarithmic scale is to be noted in ordinates). By extrapolating the threshold twice, a voltage variation of about 1/100 millivolts would be found and unable to be exploited. This is why in this technique, one is always close to the threshold (most of the measurements referred to in the article mentioned correspond to a polarization current equal to 1.1 times the threshold current).

It can be conceived that a voltage variation such as that of FIG. 1 may make it possible to carry out frequency control: if the frequency F of the master laser is taken as a reference, by taking the variation of the voltage at the terminals of the slave laser as an error signal, it could be possible to bring the central frequency Fo of the slave laser back to the frequency F by modifying the temperature of the slave laser, for example.

If on the other hand, it is desired to know the variations of the frequency of the signal injected with respect to the frequency Fo, it would be necessary to derive the voltage variation represented on FIG. 1. Then a curve would be obtained such as the one of FIG. 3, which roughly corresponds to one of the curves of FIG. 12 of the aforesaid document.

This additional derivation operation constitutes a complication. In fact, it is dispensed with since this method remains a means for stabilizing the frequency of a slave laser with respect to a master laser and not a frequency demodulation device.

In this known technique, as mentioned earlier, the semiconductor slave laser functions as an amplifier close to the threshold and the voltage taken at its terminals always undergoes a negative bell-shaped variation, the measured voltage variation only giving the frequency difference but not its sign.

SUMMARY OF THE INVENTION

In certain respects, the present invention takes up this technique but by implementing it in an original way so that the voltage taken at the terminals of the slave laser represent the frequency difference, not only in terms of extent but also in terms of sign. Thus, there is no longer any need to carry out a derivation of the appropriated signal. Surprisingly and extremely advantageously, the frequency modulation of the incident signal is directly expressed by a voltage modulation.

This result is obtained by making the photoreceptor laser (or slave) function well above the threshold, that is in practice at more than twice the threshold. In these circumstances, the laser no longer functions as an amplifier, as in the prior art, but as an oscillator. It then has an actual oscillation frequency Fo (or an actual wavelength λo). The introduction of a luminous beam into the active layer of this oscillator does not significantly modify the density of the photons, which is already extremely large owing to the oscillation functioning condition well above the threshold. The phenomenon described eariler with regard to the prior art, if it exists, is insignificant. Moreover, as indicated earlier, the curve of FIG. 2 shows that by being placed twice above the threshold, this phenomenon almost disappears.

A further mechanism appears, which brings into play other phenomena: under the effect of injecting the beam at the frequency F different from Fo, the frequency of the oscillator shall slide; this frequency sliding is rendered possible by a variation of the refraction index of the active layer. This variation $\Delta F = F - Fo$ is positive or negative according to the place of F with respect to Fo. If F is less than Fo (in other words, if the wavelength λ is greater than λo), the refraction index increases and the frequency of the oscillator shall be locked or fixed on F. This index increase is obtained by reducing the density of bearers in the active layer. If the index reduces, the density of bearers shall increase, as the index variation per unit of bearer density variation (dn/dN) ratio is negative, and vice versa. But the density of bearers also determines the separation of Fermi quasi-levels in the active layer and the latter corresponds to the voltage at the terminals of the junction point pn of the laser. This voltage shall thus diminish when F shall be less than Fo and increase if F is more than Fo. It shall remain unchanged if F=Fo.

Thus, a voltage variation is obtained which, in terms of extent and sign, corresponds to the difference between the frequency F of the incident beam and the actual frequency Fo of the reference laser oscillator.

The main differences with the phenomenon involved in the prior Art shall be noted: whereas in the latter the voltage variation was always negative and maximum for F=Fo, in the invention the variation is at one moment positive and another moment negative and is nil for F=Fo. In the invention, the photoreceptor directly detects the frequency difference without there being any need to resort to using an auxiliary derivation circuit.

The performances of this new photoreceptor are thus extremely advantageous. By way of illustration, the Applicant has obtained the following results:

wavelength selectivity: 0.04 nm for an optical power of −30 dBm, electric pass-range exceeding 2 GHz, sensitivity: −30 dBm, voltage/frequency conversion factor (dV/dF): about 50 µV/GHz at 750 MHz, wavelength tuning by change of temperature: 0.065 nm/°C. and by changing polarization current: 0.013 nm/mA, dimensions: 0.4×0.1×0.3 mm3.

More specifically, the object of the invention is to provide a photoreceptor for frequency-modulated optical signals and including a monofrequency semiconductor laser with an active layer, a threshold current and an actual frequency, a polarization current source feeding the laser beyond the threshold, optical means to inject a frequency-modulated luminous beam into an active layer of the laser, a device to take up the electric voltage at the terminals of the laser, this photoreceptor being characterized by the fact that the feed current produced by the source is adjusted to a value much higher than the laser threshold, the laser then functioning as an oscillator, the device for taking up the voltage then delivering a voltage exhibiting, with respect to the actual voltage taken in the absence of the injected beam, a variation whose amplitude is proportional to the difference between the frequency of the injected beam and the actual frequency of the laser and a sign, namely that of said frequency difference, the frequency modulation of the luminous beam thus being directly translated into the amplitude modulation of the voltage appropriated at the laser terminals.

The feed current of the laser is preferably two times greater than the threshold current.

BRIEF DESCRIPTION OF THE DRAWINGS

In any event, the characteristics and advantages of the invention shall appear more readily from a reading of the following description with reference to the accompanying drawings in which.

DETAILED DESCRIPTION OF THE PREFERRED EMBODIMENTS

Figure 1:
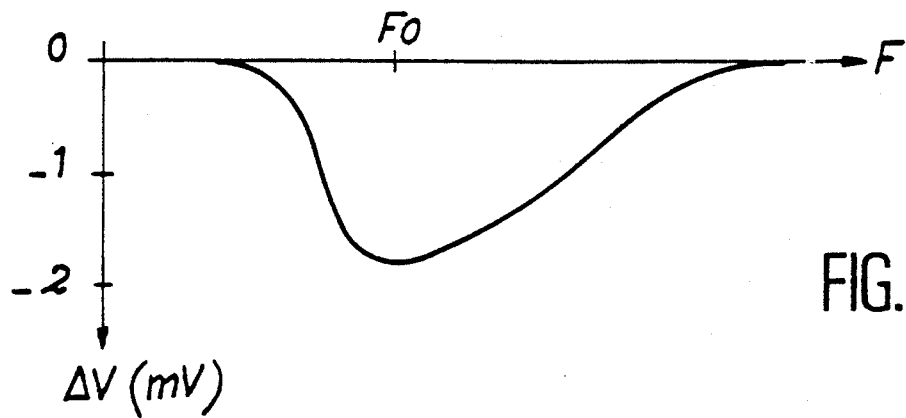
FIG. 1, already described, shows the voltage variation obtained according to the prior art according to the frequency, FIG. 2, already described, shows the voltage variation obtained according to the prior art according to the polarization current, FIG. 3, already described, shows the derivative of the voltage obtained according to the prior art.
Figure 2:
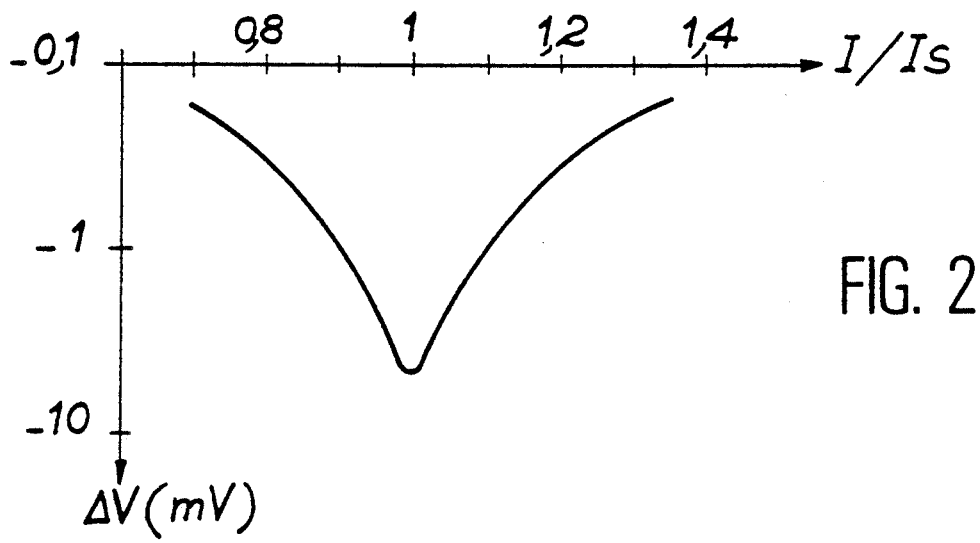
Figure 3:
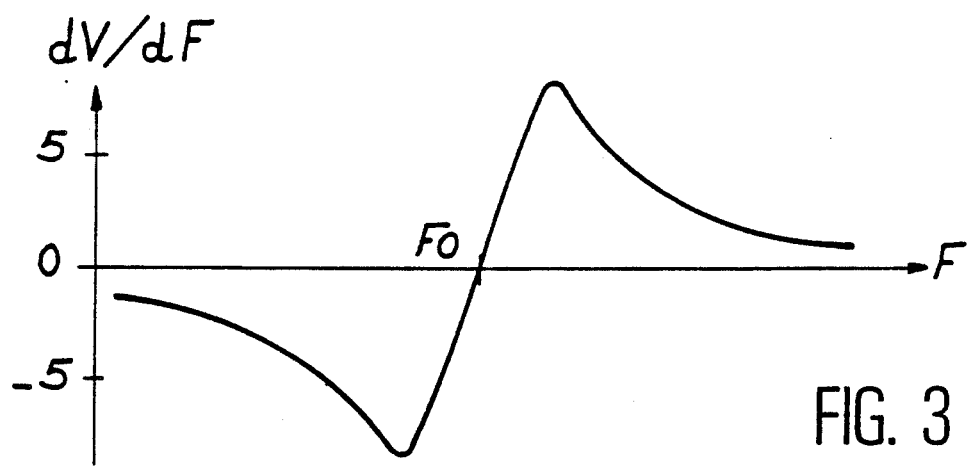
Figure 4:
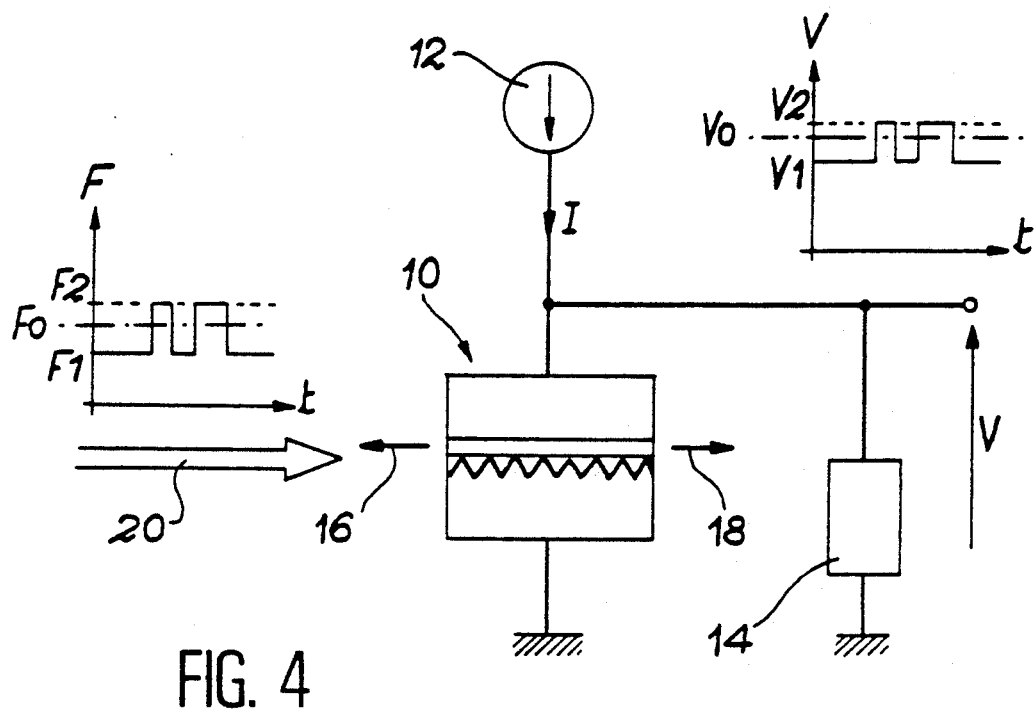
FIG. 4 illustrates the operating principle of the photoreceptor of the invention.

FIG. 4 shows a distributed feedback type laser 10. Such a laser is conventionally made up of a stack of semiconductive layers with in particular one active layer framed by two containment layers and one distributed network. The semiconductor may belong to the family of III-V binary, ternary or quaternary type compounds, such as InGaAsP on InP. The laser is fed by a current source 12 and is equipped with a device 14 for measuring the voltage at its terminals.

The injected curent I is two times greater than the threshold current Is of the laser. The laser is thus placed in its operating state as an oscillator. It emits a luminous radiation 16, 18 with a wavelength λo (or with a frequency of Fo).

The relative intensities of the radiations 11 and 18 depend on the reflection coefficients of the faces of the laser. There is no point in stating these conditions which have no direct bearing on the invention.

A luminous beam 20 with a frequency F (or wavelength λ) is injected into the laser 10. Its frequency is assumed to be able to be modulated. By way of explanation, the left of the drawing is a diagram showing that the frequency may assume two values F1 and F2 (F1 may correspond to a logical 0 and F2 to a logical 1 in a binary information system).

The voltage V taken at the laser terminals by the device 14 then assumes two values V1 and V2 represented on the right section and corresponding to the two frequencies F1 and F2.

In this example, it is supposed that the frequencies F1 and F2 would frame the actual frequency Fo of the laser, F2 being greater then Fo. In this hypothesis and in accordance with the explanations given earlier, the operating frequency of the receiving laser shall slide towards F1 or F2 under the effect of the injection of the beam 20, which shall shift the operating voltage upwards or downwards. The difference with the prior art thus appears clearly, as in this prior art, the voltage variation was always negative. With two frequencies also spaced from the actual frequency of the laser, this would be obtained in the prior art approximately at the same voltage at the laser terminals, which would result in a serious difficulty in order to distinguish them from each other.

Figure 5:
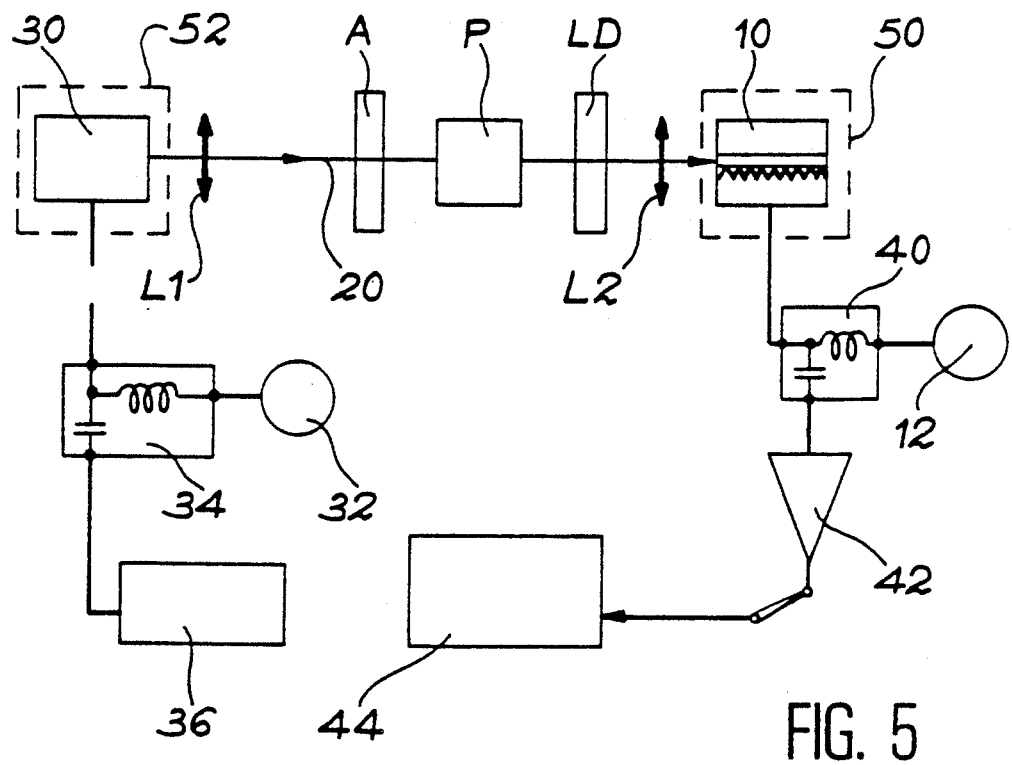
FIG. 5 shows an experimental assembly using the photoreceptor of the invention.

FIG. 5 shows an experimental assembly making it possible to examine the photoreceptor of the invention. Here, the laser 10 is fed by the source 12. It also shows a laser 30 acting as an emitter, this laser being fed by a current source 32 through a "T" 34 including an inductive resistor and a capacitor, the latter being connected to a high-frequency oscillator 36. The current injected into the laser 30 is thus intensity-modulated. As a result, the emitted luminous beam is frequency-modulated around a mean frequency.

Optical means are also provided to inject the modulated beam into the laser 10 acting as a photoreceptor. These means include a first lens L1, an attenuator A, a polarizer P, a half-wave plate LD and a second lens L2 able to be a microscope lens. The means A, P and LD fulfil the optical isolator function.

As for the means for measuring the voltage at the laser terminals, these include, after a "T" 40 constituted by an inductive resistor and a capacitor, an amplifier 42 and a spectrum analyzer 44. This analyzer gives the intensity of the voltage component at the modulation frequency of the generator 36.

The assembly further includes means to stabilize the temperature of the lasers shown diagrammatically by the broken rectangles 50 and 52.

Figure 6:
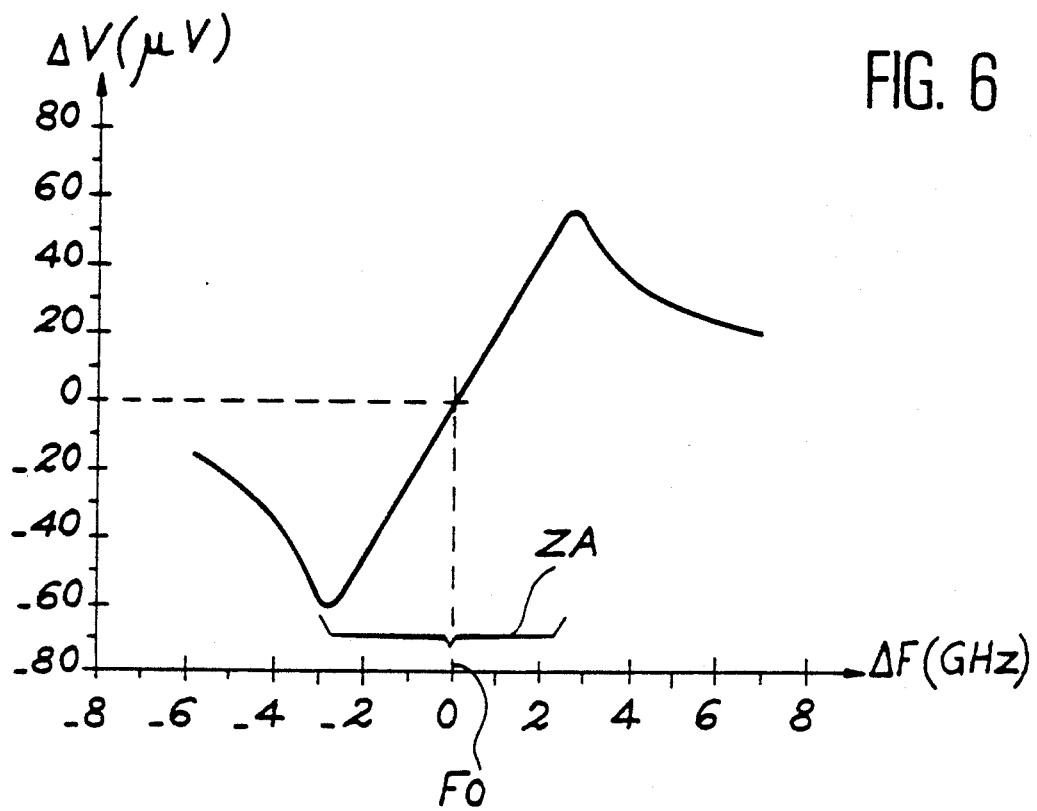
FIG. 6 illustrates the variations of the voltage appropriated at the laser terminals according to the frequency difference.
Figure 7:
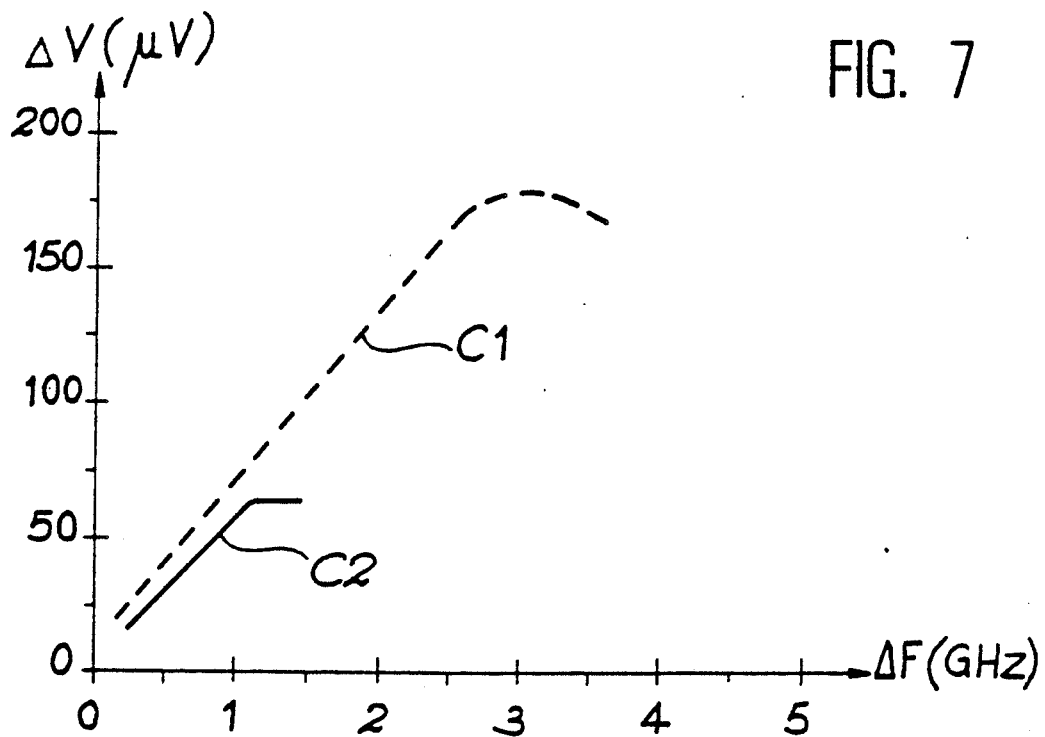
FIG. 7 shows two particular cases of this voltage variation with two different optical powers.

Such an assembly has enabled the Applicant to measure a certain number of quantities, as shown on FIGS. 6 and 7. In these measurements, the polarization current of the emitting and receiving lasers was respectively 35 and 49 mA, that is 2.2 times the threshold current. The temperature of the lasers was stabilized at 20° C. The optical frequency of the emitting laser (or receiving laser) was able to be displaced by varying the temperature. Modulation of the emitting laser was obtained by modulating the polarization current.

FIG. 6 firstly shows the variation of the voltage $\Delta V$ expressed in microvolts and laid off as ordinates according to the difference of the frequency $\Delta F$ expressed in gigahertz, this difference being between the frequency F of the emitting laser 30 and the actual frequency Fo of the receiving laser 10.

The shown curve corresponds to an injected power of $-30$ dBm.

The zone marked ZA corresponds to the locking range, that is the range where the photoreceptor is locked at the frequency of the injected beam. In this range, the voltage/frequency ratio is linear. Outside this range, the difference $F - Fo$ is too large for the oscillator to be locked onto the frequency of the injected wave. It reassumes its natural oscillation conditions at the frequency Fo and the voltage reassumes its nominal value.

FIG. 7 gives similar curves for a modulation frequency equal to 750 MHz. The curve C1 corresponds to an injected optical power of $-30$ dBm, namely 1 $\mu$W, and the curve C2 at $-40$ dBm, namely 0.1 $\mu$W.

The conversion ratio is about 52 V/GHz.

Figure 8:
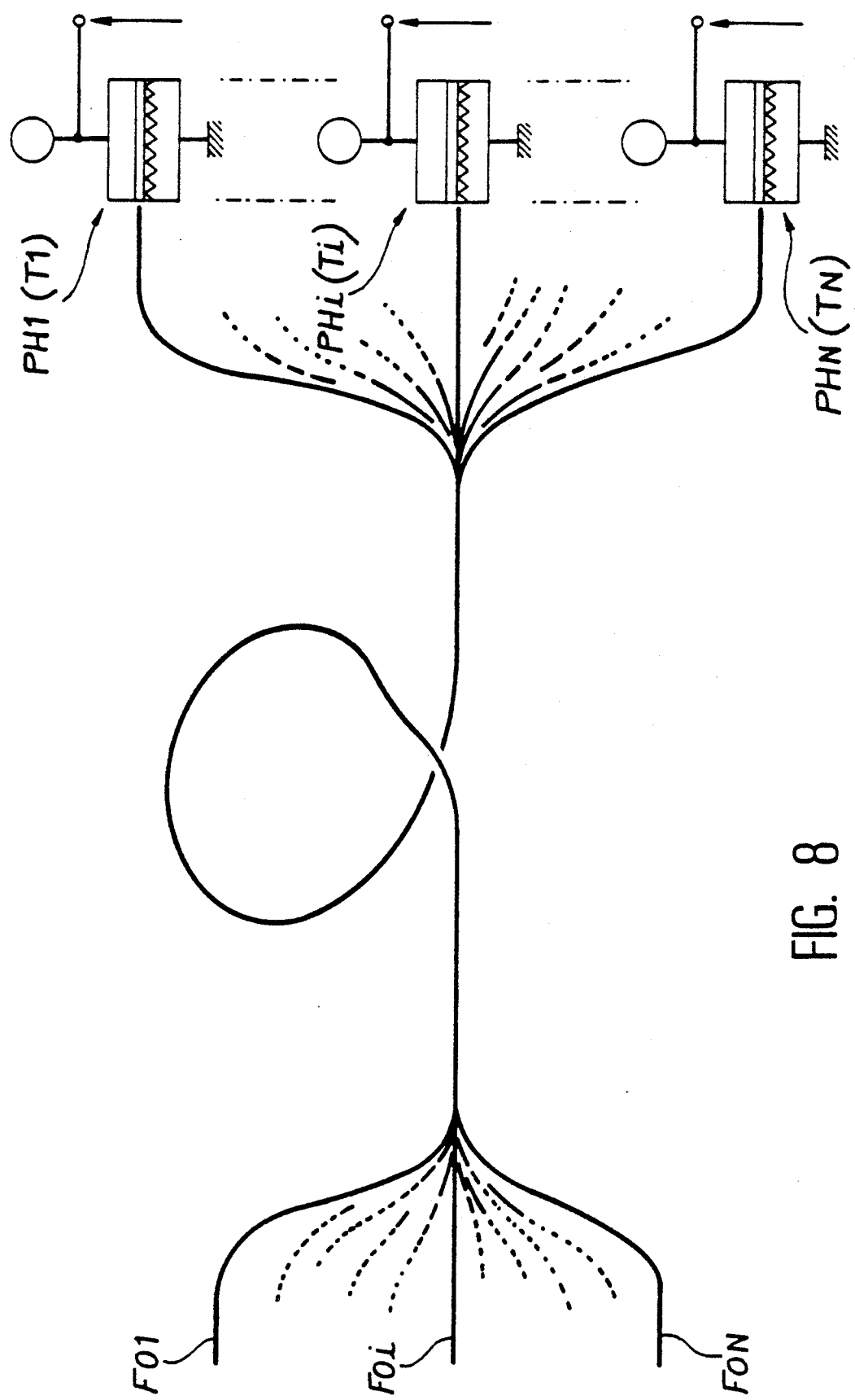
FIG. 8 shows a multiplexing/demultiplexing device using a plurality of photoreceptors according to the invention.

By modifying the temperature of the photoreceptor or its polarization current, it is possible to displace the actual frequency Fo and accordingly the locking zone. Thus, it is possible to use the same type of photoreceptor but on diverse wavelengths, which is useful in a multiplexed system. This is represented on FIG. 8 which shows a plurality of N optical fibers FO1, ..., FOi, ... FON carrying optical signals respectively on the wavelength $\lambda 1, ..., \lambda i, ... \lambda N$ and, on the receiving side, a given plurality of N photoreceptors PH1, ..., PHi, ..., PHN stabilized at temperatures T1, ..., Ti, ..., TN for functioning on the wavelengths $\lambda 1, ..., \lambda i, ..., \lambda N$.

Of course, the preceding description only mentions DFB lasers by way of explanation. Any other laser may be used, including quantal pit/active layer lasers, multiple electrode lasers (the laser chip is fed by several separate electrodes) and multi-section lasers (composed of reflecting, guide and amplifying sections).

What is claimed is:

1. A photoreceptor for frequency modulated optical signals, comprising:
   a semiconductor laser having an active layer, a threshold current level, a natural operating frequency, a polarization current source, feeding laser current from at least one first terminal through said semiconductor laser to at least one second terminal, wherein said laser current is at least twice said threshold current level, said semiconductor laser being in an oscillating state;

means for injecting a frequency modulated optical beam having an injection lock frequency into said active layer; thereby injection locking said semiconductor laser at said injection lock frequency;

voltage measuring means for measuring voltage variations between said first terminals and said second terminals; wherein said voltage variation is linearly proportional to the difference between said injection lock frequency and said natural frequency over the range of frequency that said semiconductor laser is injection locked to said frequency modulated optical beam.

2. Photoreceptor according to claim 1, further comprising means to adjust said natural frequency of the laser to a specific value.

3. Photoreceptor acording to claim 2, wherein the means to adjust the said natural frequency of the laser are temperature adjustment means.

4. Photoreceptor according to claim 1, wherein the laser is a distributed feedback (DFB) type laser.

5. Photoreceptor according to claim 1, wherein the laser is a quantal pit type laser.

6. Photoreceptor according to claim 1, wherein the laser is a multiple electrode type laser.

7. Photoreceptor according to claim 1, wherein the laser is a multisection type laser.

8. A photoreceptor, according to claim 1, wherein the refractive index of said active layer increases when the injection lock frequency of operation decreases.

9. A photoreceptor, according to claim 2, further comprising a plurality of photoreceptors which are each associated with a laser adjusted to a selected frequency.

* * * * *